United States Patent
Douskey et al.

(10) Patent No.: US 10,024,914 B2
(45) Date of Patent: Jul. 17, 2018

(54) DIAGNOSING FAILURE LOCATIONS OF AN INTEGRATED CIRCUIT WITH LOGIC BUILT-IN SELF-TEST

(71) Applicant: GLOBALFOUNDRIES INC., Grand Cayman (KY)

(72) Inventors: Steven M. Douskey, Rochester, MN (US); Amanda R. Kaufer, Rochester, MN (US); Leah Marie Pfeifer Pastel, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 148 days.

(21) Appl. No.: 15/196,915

(22) Filed: Jun. 29, 2016

(65) Prior Publication Data

US 2018/0003768 A1 Jan. 4, 2018

(51) Int. Cl.
  *G01R 31/3177* (2006.01)
  *G01R 31/28* (2006.01)

(52) U.S. Cl.
  CPC ..... *G01R 31/3177* (2013.01); *G01R 31/2884* (2013.01)

(58) Field of Classification Search
  CPC .................. G01R 31/2884; G01R 31/3177
  See application file for complete search history.

(56) References Cited

U.S. PATENT DOCUMENTS

| | | | |
|---|---|---|---|
| 6,442,723 B1 | 8/2002 | Koprowski et al. | |
| 6,516,432 B1 | 2/2003 | Motika et al. | |
| 6,807,645 B2 * | 10/2004 | Angelotti | G01R 31/31813 714/729 |
| 7,487,420 B2 | 2/2009 | Keller | |
| 7,509,551 B2 | 3/2009 | Koenemann et al. | |
| 7,523,370 B1 * | 4/2009 | Keller | G01R 31/318547 714/726 |
| 7,644,333 B2 * | 1/2010 | Hill | G01R 31/318547 714/726 |
| 7,702,980 B2 | 4/2010 | Chen | |
| 7,908,532 B2 * | 3/2011 | Eckelman | G01R 31/318544 714/726 |
| 8,166,360 B2 | 4/2012 | Koenemann et al. | |

(Continued)

OTHER PUBLICATIONS

Y. Son, J. Chong and G. Russell, "E-BIST: enhanced test-per-clock BIST architecture," in IEE Proceedings—Computers and Digital Techniques, vol. 149, No. 1, pp. 9-15, Jan. 2002.*

*Primary Examiner* — Cynthia Britt
(74) *Attorney, Agent, or Firm* — Gibb & Riley, LLC; Michael J. LeStrange, Esq.

(57) ABSTRACT

A method and system of testing an integrated circuit (IC), using a multiple input shift register (MISR) with supporting hardware for diagnosing failure locations in an IC with built-in self-test (BIST) logic, including an On-Product MISR. The system includes BIST logic of a circuit under test (CUT) and a tester including an isolation hash table (IHT) that translates signature fail data of the MISR to a failure location of a latch in the CUT. Signature fail data, and consequently, failure locations in the CUT, are obtained by standard testing of the CUT, testing of selected single channels of the CUT, and data insertion functions to the selected single channels of the CUT to obtain compressed MISR signature changes that, when translated, provide failure locations in the CUT.

20 Claims, 5 Drawing Sheets

(56) References Cited

U.S. PATENT DOCUMENTS

| | | |
|---|---|---|
| 8,448,032 B2 | 5/2013 | Sharma et al. |
| 8,843,797 B2 * | 9/2014 | Motika .......... G01R 31/318547 |
| | | 714/25 |
| 9,110,135 B2 | 8/2015 | Douskey et al. |
| 2006/0200719 A1 | 9/2006 | Keller |
| 2014/0149814 A1 * | 5/2014 | Al-omari ....... G01R 31/318566 |
| | | 714/727 |

* cited by examiner

DIAGNOSING FAILURE LOCATIONS OF AN INTEGRATED CIRCUIT WITH LOGIC BUILT-IN SELF-TEST

BACKGROUND

The present disclosure relates to a method and system of testing an integrated circuit (IC), using a method of compression with hardware support to limit aliasing of a multiple input shift register (MISR) for diagnosing failure locations in an IC with built-in self-test (BIST) logic, including On-Product multiple input shift register (OPMISR) logic.

Design for testing (DFT) includes IC design techniques that add testability features to a hardware product design. The added features make it easier to develop and apply manufacturing tests to the designed hardware. The purpose of manufacturing tests is to validate the product hardware as containing no manufacturing failures that could adversely impact the product's designed operation.

In built-in self-test (BIST) logic, hardware and/or software are built into ICs allowing them to test their own operation, as opposed to reliance on external automated test equipment (ATE). Generally, this additional hardware comprises a pseudo-random pattern generator (PRPG), implemented by a linear feedback shift register, and a test response analyzer, typically, a multiple input shift register (MISR). With BIST logic, pseudo random test patterns are applied to the chip under test (CUT) through scan chains using the PRPG, and the response of the CUT to these pseudo-random patterns is compacted into a test signature by the test response analyzer. Since BIST logic only applies pseudo-random patterns, it cannot achieve the same fault coverage as a scan-based structural test set generated by an Automatic Test Pattern Generation (ATPG) tool, which requires an extremely large test data volume. However, since BIST logic uses an on-chip PRPG, it requires minimal support from the external test environment. Ordinarily, the only interaction with the outside test environment is at the beginning of testing when an initial seed for the PRPG along with a start signal is provided, and at the end of testing when the test signature in the test response analyzer is compared with a "golden", i.e., good, signature. For this reason, BIST logic can be used to apply millions of test patterns to the CUT with the aim of capturing an unexpected response. The main advantage of BIST logic is the ability to test internal circuits having no direct connections to external pins. Another advantage is the ability to initiate the BIST logic of a CUT while running the built-in self-test or a power-on self-test of the manufactured IC.

OPMISR testing, like BIST logic, uses the MISR to collect compressed results, thus saving tester data volume, but rather than using PRPG generated test data, like Automatic Test Pattern Generation (ATPG) testing it uses deterministic data stored on the tester. In this manner the data volume is greater than that of BIST logic, but much reduced from normal full scan ATPG patterns. The data can also be more focused on the needs for the specific design so will get better test coverage than the pseudo-random BIST logic design.

BIST and OPMISR logic design and test methodology support level sensitive scan design (LSSD) or generalized scan design (GSD, also known as MUXscan), to facilitate circuit testing and diagnostics. LSSD or GSD modify existing sequential elements, e.g., flip-flops, in the IC design to support serial shift capability, in addition to their normal operation. In effect, these modified elements are connected into serial chains to make long shift registers. Each scan chain element operates as both a primary input or a primary output during test, enhancing the controllability and observability of internal nodes of the IC design. However, only an external ATPG tool having the required tester data volume can carry out application of logic test patterns to be applied to a fully isolated combinatorial block, i.e., a full scan.

DFT compression schemes using multiple input shift registers (MISRs) are efficient for go/no go testing and mitigate test data volume problems, but the consequent compression makes failure diagnosis simulation difficult or even impossible. In addition, the compression can alias the MISR observe or signature fail data, significantly impacting diagnostic resolution or not converging to a solution. Thus, failure diagnosis is substantially degraded, which negatively impacts volume diagnostics for IC yield learning. Furthermore, for IC designs with high logic content, the majority of logic test patterns are compressed tests, which means that if they fail, there is no diagnostic alternative on the tester to collect full-scan diagnostics fail data, which could isolate the location of a single latch that is observed to fail.

There remains a need for efficient diagnostics from signatures of a multiple input shift register (MISR) in built-in self-test (BIST) logic, including On-product MISR (OPMISR) logic, to isolate one or more latches that observe fail during a compressed test pattern.

SUMMARY

In an embodiment of the disclosure, a system includes built-in self-test (BIST) logic of a circuit under test (CUT). The BIST logic further includes a mask that selectively masks at least one channel of scan chain elements corresponding to logic circuits of the CUT, Hamming logic that minimizes aliasing, a multiple input shift register (MISR) that receives Hamming data and unloads a compressed MISR signature, and an aperture point enabled by a scan counter of the scan chain elements that inserts a data value into at least one of the scan chain elements transmitted to the MISR. The system also includes a tester, external to the BIST logic and the CUT. The tester further includes at least: a controller, a CUT MISR data store, a channel MISR data store, and an isolation hash table (IHT), where the controller controls communications between the BIST logic, the CUT, the CUT MISR data store, the channel MISR data store, and the IHT, the IHT translates signature fail data from the MISR to a failure location of a latch in the CUT.

In another embodiment of the disclosure, a method includes: storing compressed multiple input shift register (MISR) expect data for each channel scanned from a passing integrated circuit (IC); storing a failure location of each scan cell of each scan chain of each channel translated from signature fail data from the MISR in an isolation hash table (IHT); running a standard test, using circuit under test (CUT) data, of the CUT, where for each scan cell of each scan chain of each channel at least one compressed MISR signature does not match the MISR expect data and where translated bits of the at least one compressed MISR signature do not match an entry in the IHT; storing compressed MISR single channel expect data for each scan cell of each scan chain of each single channel scanned from a passing IC; running a standard test, using channel MISR data, of the CUT, where for each scan cell of each scan chain of a selected single channel at least one compressed MISR single channel signature does not match the MISR single channel expect data and where translated bits of the at least one compressed MISR single channel signature do not match an entry in the IHT; and running a standard test, using the channel MISR data, of the CUT, where a selected data value is inserted into at least one location of a scan chain of the selected single channel for transmission to the MISR, resulting in a compressed MISR signature change that when translated matches an entry in the IHT, to provide the failure location of at least one latch in the CUT.

In yet another embodiment of the disclosure, a method includes: storing compressed multiple input shift register (MISR) expect data for each channel scanned from a passing integrated circuit (IC); storing a failure location of each scan cell of each scan chain of each channel translated from signature fail data from the MISR in an isolation hash table (IHT); running a standard test using circuit under test (CUT) MISR data to determine if the CUT fails; running channel diagnostics for every channel of the CUT to determine if at least one of the channels fails; and running aperture diagnostics for every failing channel of the CUT to determine a failure location of at least one latches in the CUT.

BRIEF DESCRIPTION OF THE DRAWINGS

The embodiments herein will be better understood from the following detailed description with reference to the drawings, which are not necessarily drawn to scale and in which.

DETAILED DESCRIPTION

As stated above, there remains a need for efficient diagnostics from signatures of a multiple input shift register (MISR) in built-in self-test (BIST) logic, including On-product MISR (OPMISR) logic, to isolate one or more latches that observe fail during a compressed test pattern.

Figure 5:
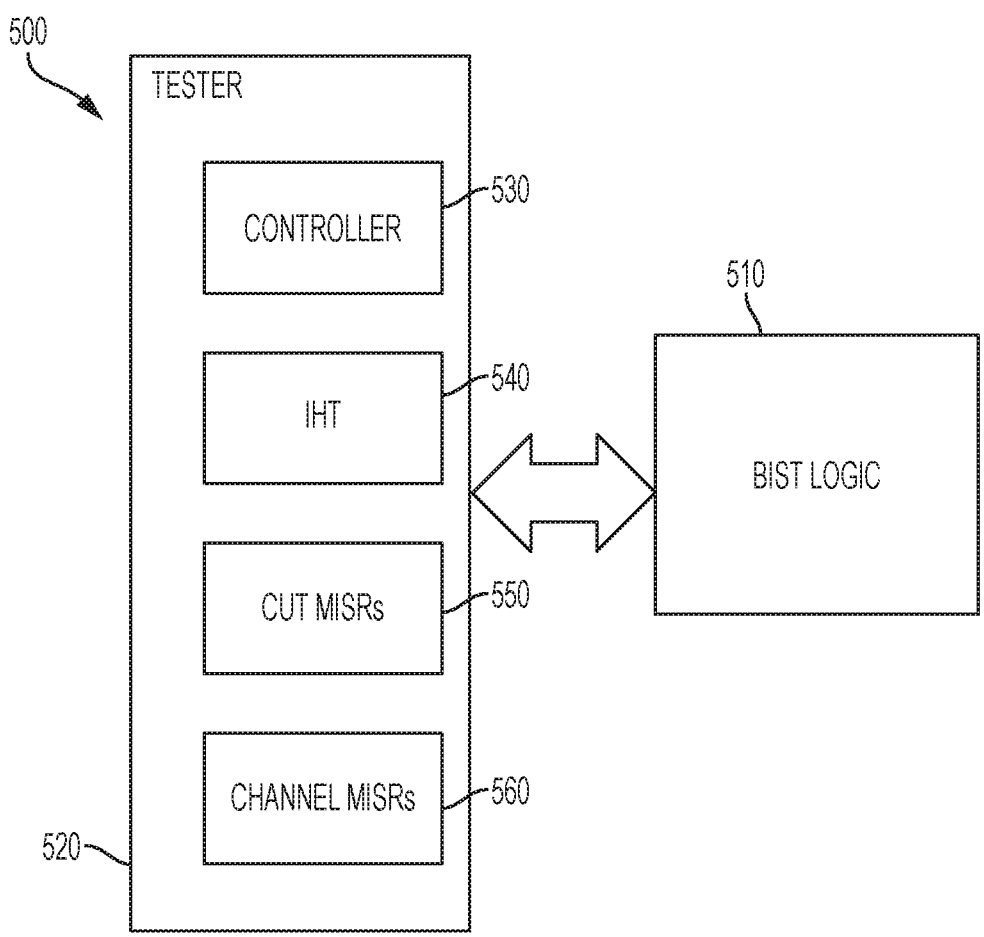
FIG. 5 is a schematic diagram illustrating a system for diagnosing failure locations in an integrated circuit (IC) chip with built-in self-test (BIST) logic that communicates with a tester in an embodiment herein.

Referring to FIG. 5, an exemplary embodiment of a system 500 for diagnosing failure locations in an integrated circuit (IC) chip with built-in self-test (BIST) logic may include BIST logic 510 in communication with a tester 520 containing at least a controller 530, an Isolation Hash Table (IHT) 540, circuit under test (CUT) MISR data 550, and channel MISR data 560, which is described in detail below.

Figure 1:
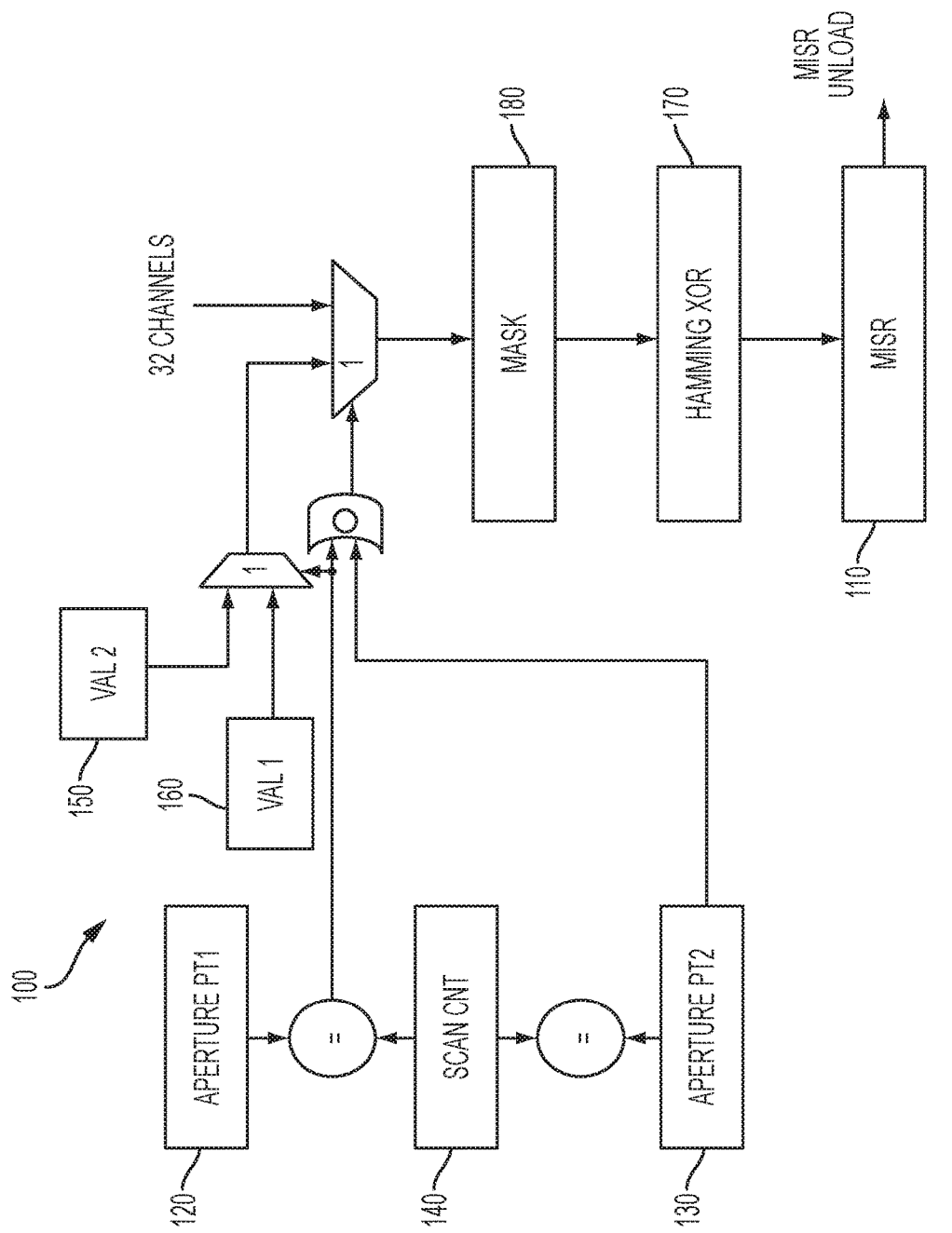
FIG. 1 is a schematic diagram illustrating an integrated circuit (IC) chip with compressed data collection and data correction aperture logic in an embodiment herein.

Referring to FIG. 1, an exemplary embodiment of the BIST logic 510 may include an On-Product Multiple Input Shift Register (MISR) 110 and additional on-product supporting structures, to limit aliasing of the MISR 110 and to isolate one or more multiple failures in an IC chip with built-in self-test (BIST) logic 100 using a reduced set of expect data. The MISR 110 may be, for example, 32 bits wide and support 32 channels, i.e., scan chains, each having a depth of, for example, 1000 bits or less, for a failure field of about 32,000 bits. The system may also include two aperture points 120, 130 that are compared to a scan count of a scan counter 140 and that are used to insert set values 150, 160 into a scan ring for an aperture correction attempt for diagnostics by the MISR. The BIST logic 100 may also include Hamming logic 170 that is added before the MISR 110 to minimize aliasing. Hamming logic produces a binary code that is used to detect and correct data transmission errors. One form of Hamming logic typically used for compressed full scan ATPG is an XOR network that allows every channel to be detected at a unique set of multiple pins from every other channel. In this manner, should two channels have flipped data, they will not erase each other and alias to a passing result. Similarly, the Hamming logic before the MISR outputs Hamming data that minimizes aliasing by feeding each channel to multiple unique MISR bits. Alternatively, an XOR MISR that does not have an aliasing issue for single bit fails may be an alternative to the Hamming logic 170 and MISR 110 combination.

Figure 2:
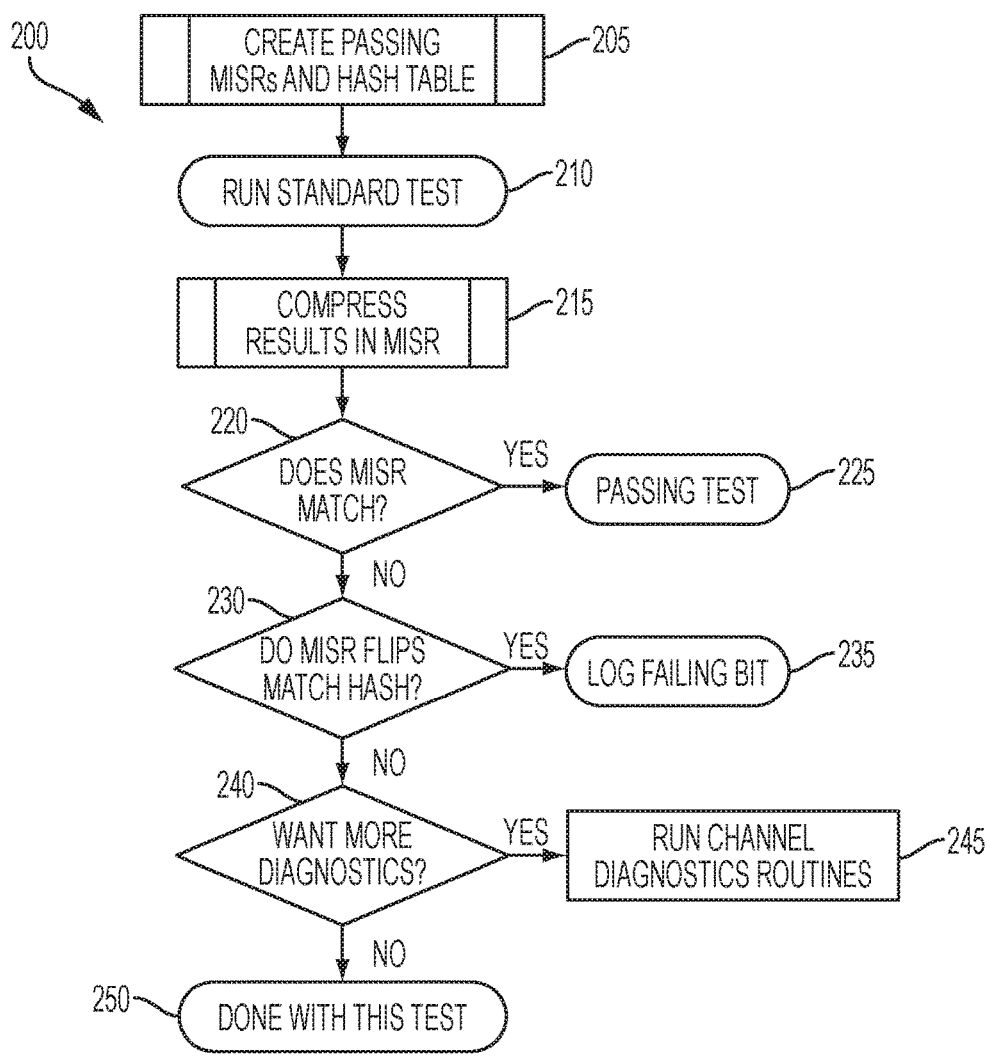
FIG. 2 is a flow chart illustrating a method for diagnosing a single failure location in an IC chip with BIST logic in an embodiment herein.

Referring to FIG. 2, an exemplary embodiment of a method, to isolate one failure to one of possibly many MISRs in a chip under test (CUT), may be illustrated by flowchart 200. Before standard testing of the CUT, the compressed MISR expect data, i.e., signatures, for all 32 channels and for each scan cell of each channel is created by operation of a passing IC and stored in a tester 520. Before standard testing, an external Isolation Hash Table (IHT) 540 is also created in the tester 520, where the contents of the IHT 540, i.e., the hashed bits of signature fail data, are solely dependent upon the depth of the longest channel, operation of any Hamming logic on the scan chains, and the MISR feedback equation, to translate the signature fail data from the MISR to a failure location of a latch, 205. The IHT 540 contents do not change, if there is a different, e.g. faulty, logic in the CUT, nor if the channels are masked fully by the mask or partially by the aperture points. In step 210, a standard test of the CUT is performed and the resulting compressed MISR signatures are obtained in step 215. Each of the compressed signatures of the MISR of the CUT is unloaded and compared to the corresponding compressed MISR expect data from the passing IC that is stored in the tester 520 in step 220. If each of the compressed signatures of the MISR of the CUT matches the corresponding compressed MISR expect data stored in the tester 520, then the CUT passes the standard test, 225. If any of the compressed signatures of the MISR of the CUT do not match the corresponding compressed MISR expect data, i.e., a test fails, then each of the bits from the failing hashed compression signature of the CUT is compared to the stored bits of the hashed compression signatures in the IHT 540 to determine a failing bit in step 230. In step 235, the failing bit is logged in the controller 530. If the standard test fails in step 220, and if no failing bit is detected in step 230 because, presumably, 2 or more bits may have failed, then the system queries whether further diagnostics are to be performed in step 240. If further diagnostics are to be performed by the system, then channel diagnostics, shown in FIG. 3 below, are run in step 245. If no further diagnostics are to be performed, then standard signature testing is completed in step 250.

Referring back to FIG. 1, an on-product mask 180 of the BIST logic 100 selectively allows each of the 32 channels to be masked, to provide further isolation of possible failures in the CUT during test.

Figure 3:
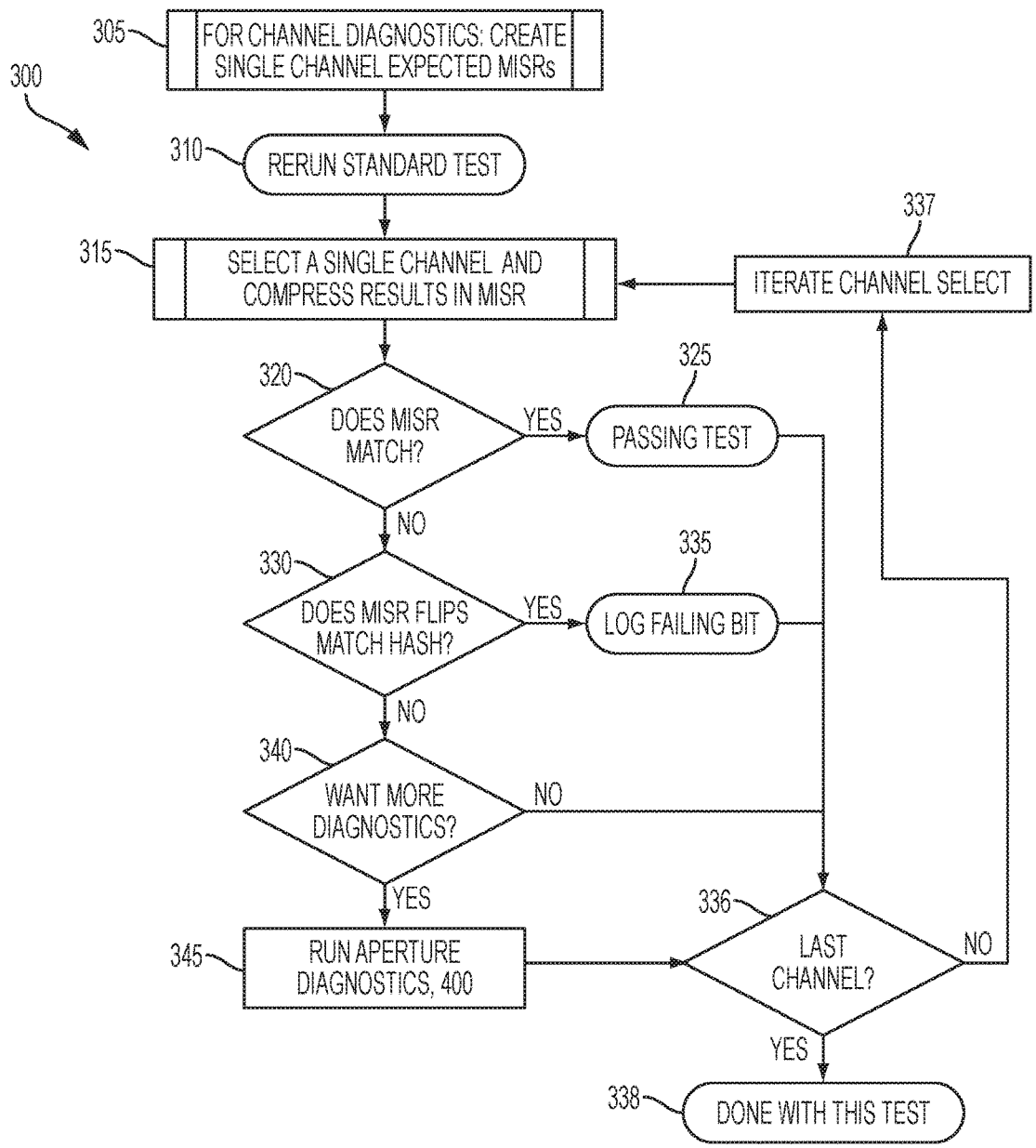
FIG. 3 is a flow chart illustrating a method for diagnosing a single failure locations in each selected single channel of an IC chip with BIST logic in an embodiment herein.

Referring to FIG. 3, the exemplary embodiment of the method may further include the channel diagnostics, to limit aliasing of the MISR and to further isolate one or more multiple failures in a chip under test (CUT), as illustrated by flowchart 300. Flowchart 300 illustrates how to use existing channel masks to reduce the chance that multiple failing locations overlap and create an undecipherable MISR answer. Basically, the same method as that outlined by flowchart 200 of FIG. 2 is performed, but with all but one channel masked at a time. With channel diagnostics being run for one channel at a time, a new expect data MISR for the one channel, run with all other channels being masked, and the same IHT 540, the diagnostics for each channel is now performed on a reduced set of data, i.e., 1/32 of the original failure field of about 32,000 bits or about 1000 bits. However, for single channel comparisons, the IHT 540 may be reduced to only those bits that exist in the selected channel.

Before running channel diagnostics of the CUT, the compressed MISR expect data, i.e., signatures, for each one of the 32 channels is created by operation of a passing IC and stored in a tester 520 in step 305. The IHT 540 created in step 205 of FIG. 2 is used by the channel diagnostics of flowchart 300 of FIG. 3. In step 310, a standard test of the same CUT, used by the method of FIG. 2, is performed and the resulting compressed MISR signatures of the one of the 32 channels is obtained in step 315. The compressed MISR single channel signatures of the one of the 32 channels of the MISR of the CUT are unloaded and compared to the corresponding compressed MISR single channel expect data from the corresponding one of the 32 channels of the passing IC that is stored in the tester 520 in step 320. If the compressed MISR single channel signature for the one of the 32 channels of the MISR of the CUT matches the corresponding compressed MISR single channel expect data for the one of the 32 channels stored in the tester 520, then the CUT passes the standard test, 325. Upon passing the standard test 325, the system then determines whether all the channels have been tested in step 336. If all channels have been tested, the channel diagnostics are complete, 338. If any channels have not been tested, a new channel is selected a new test is run in step 337. If any of the compressed MISR single chain signatures of the one of the 32 channels of the MISR of the CUT do not match the corresponding compressed MISR single channel expect data of the corresponding one of the 32 channels, i.e., a test fail, then each of the bits from the failing hashed compressed MISR single channel signature of the one of the 32 channels of the CUT is compared to the same stored bits of the hashed compression MISR signatures in the IHT 540 to determine the failing bit in step 330. However, for single channel comparisons, the IHT 540 may be reduced to only those bits that exist in the selected channel. In step 335, the failing bit is logged in the controller 530. If the standard test fails in step 320, i.e., a NO, and if no failing bit is detected in step 330 because, presumably, 2 or more bits may have failed, then the system queries whether further diagnostics are to be performed in step 340. If further diagnostics are to be performed by the system, then aperture diagnostics are run in step 345. If no further diagnostics are to be performed and the last channel of the 32 channels has been analyzed, then channel diagnostic signature testing is completed in step 350.

Referring back to FIG. 1, the two aperture points 120, 130 of the BIST logic 100 are compared to the scan count of the scan counter 140 and are used to insert set values 150, 160 into a scan ring for aperture diagnostics.

Figure 4:
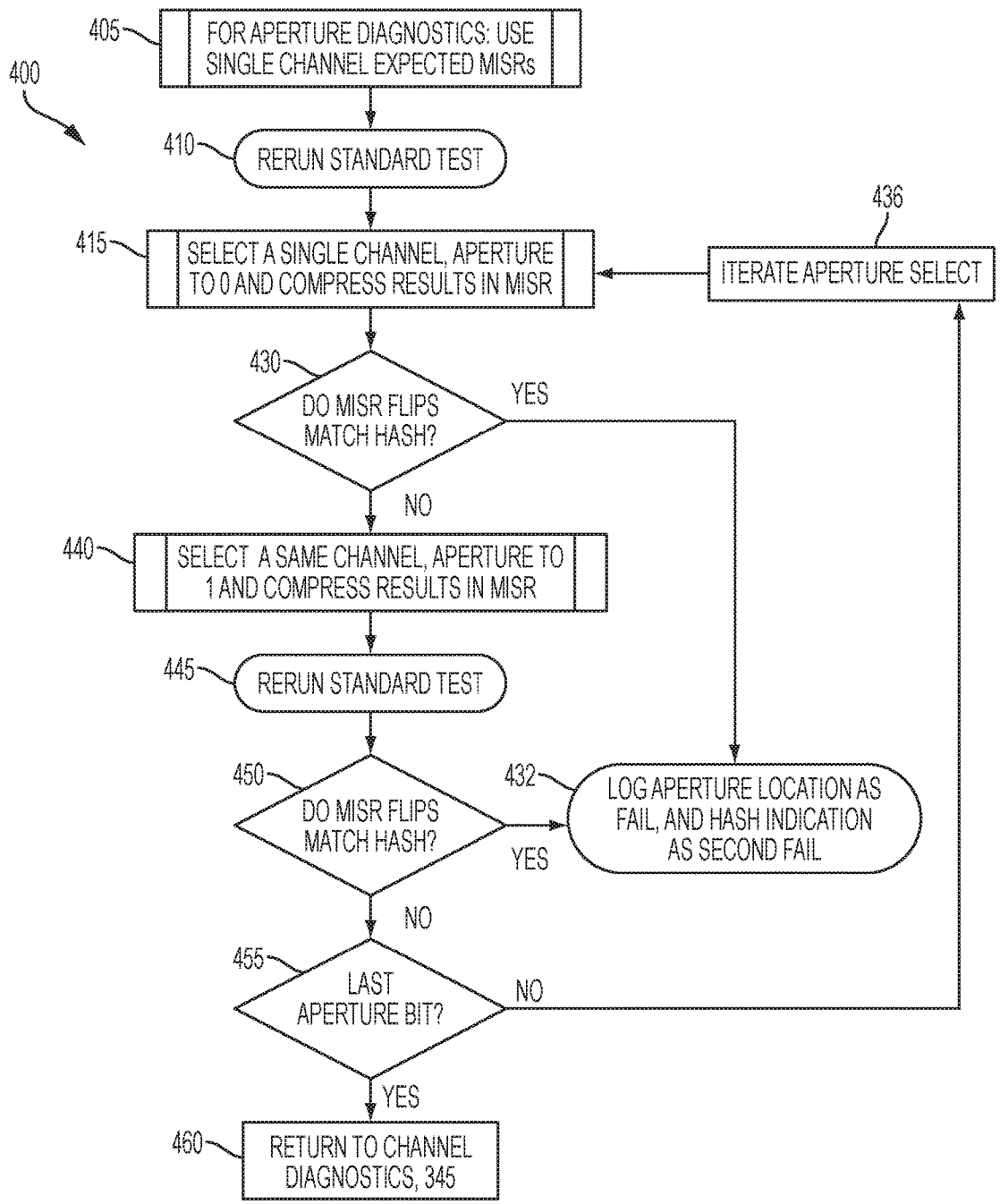
FIG. 4 is a flow chart illustrating a method for diagnosing more than one failure location by iterative data insertions within a selected single channel of an IC chip with BIST logic in an embodiment herein.

Referring to FIG. 4, the exemplary embodiment of the method may yet further include aperture data insertion functions, to yet further isolate one or more multiple failures in a chip under test (CUT), as illustrated by flowchart 400.

Previously, the channel diagnostics have indicated a fail on the standard test of a single channel of the 32 channels of the CUT and no detection of a failing bit when compared to the IHT 540 because, presumably, 2 or more bits may have failed. While using each of the 32 same single channel compressed MISRs data expects and the same IHT 540 created in step 305 of FIG. 3, step an aperture point, 120 or 130 shown in FIG. 1, through the selected single channel scan bits, forcing a 0 value into one or more locations of the scan chain of the single selected channel until the resulting MISR signature changes, i.e., the new MISR bit flips, to match an entry in the IHT 540, in step 415. However, for single channel comparisons, the IHT 540 may be reduced to only those bits that exist in the selected channel. In this case, the matched entry in the IHT 540 provides the location of a fail that is logged in the controller 530 in step 432 and the aperture data provides a second fail location. If forcing a 0 value into the one or more locations of the scan chain does not result in an MISR match, then while using each of the 32 same single channel compressed MISRs data expects and the same IHT 540, again step an aperture point through the selected single channel scan bits, forcing a 1 value into one or more locations of the scan chain of the selected channel until the resulting MISR signature changes, i.e., the new MISR bit flips, to match an entry in the IHT 540, in step 450. In this new case, the matched entry in the IHT 540 may now provide the location of a fail that is logged in the controller 530 in step 432 and the aperture data provides a second fail location. Once a match is detected with the IHT 540, two failing locations are known: the bit indicated by the current aperture location, as well as the bit indicated by the IHT 540 compare, which are both logged in the controller 530 and the next channel, if any remain, may be analyzed 460. Steps 415-450 continue until the aperture bit is forced into the scan chain of the selected single channel in step 455. If the last aperture bit has been forced into the scan chain of the selected single channel and no successful isolation has occurred, further next channel and aperture diagnostic routines may still be run in step 460.

It is possible that a valid IHT 540 compare is not reached after stepping through all the scan cells of all the scan chain of all the single channels in the aperture diagnostics. Further diagnostics are possible using the two apertures 120 and 130, in which one aperture is used to set a latch value for one scan cell of the compressed MISR, and to use the other aperture to step through the remaining scan cells of the compressed MISR in the same flow as that provided by flowchart 400 of FIG. 4. In this case, a total sweep for a 1000 bit channel, i.e., the number of scan cells in the scan chain of the selected single channel, would take 999,000 test loops.

A total sweep may be potentially shortened, if more likely fail bits can be determined and tried first. One simplifying approach to a sweep of a single channel is to use knowledge from other tests that did isolate fails in the single channel and to start the sweep by setting those bits. Additionally, the failing MISR flip bits, revealed by the aperture diagnostics, that did not match the IHT 540 can be used to reduce the number of potential failing bits to be tested. Because a failing bit only flips in particular locations of the compressed signature of the MISR, any failing bit that has one or more matching flips should be used start to shorten a total sweep by setting that bit. Both a total sweep and a shortened sweep of a single selected channel, using only the current and limited data from the compressed signatures of the MISR, will increase test time. While reverting to a full scan at his point may be quicker, the full scan would still require all of the expect data of the MISR from device analyses, all single channel analyses, and all scan cell analyses of every single channel to be available.

The aperture data insert function may also be used to divide the potential failure field horizontally, much like the channels divide the potential failure field vertically. Each horizontal division may require a new expect data MISR, but if the full channel lengths had been scanned, the same IHT 540 could be used match an entry in the IHT 540 that provides the location of a fail.

In an exemplary method, a compressed signature of the MISR may be reported every n cycles, to allow a binary search to accomplished with one scan unload. For a binary search, a previously failing compressed signature of the MISR may be erased from subsequent compressed signatures of the MISR by XORing, or the MISR could be reset after each n cycles, thus making the MISR result independent from the other scan fields. However, even when using a binary search, the number of new expect MISRs would quickly approach the original data volume for scanning all of the channel's scan cells.

In another exemplary method, a variation of a binary search may involve masking every other bit for increased efficiency. Control of such masking by the system would require only two bits; one bit would enable the binary search and the other bit would select a start point of either masking the first or second bit of the compressed signatures of the MISR. New expect data MISRs would be required, but the same IHT could be used. The masking of every other bit may more efficiently isolate failures that cause latches to fail along the same regions of the scan ring. This masking of every other bit may be extended by two more bits, to mask two interleaving pairs of 4 bits, where one bit would enable the binary search and the other bit would select a start point of either masking the first or second bit of the compressed signatures of the MISR. Again, new expect data MISRs would be required, but the same IHT could be used. Control of such masking for a few passes through the channel diagnostics may provide MISR flip results that find enough failing locations to unscramble multiple bit fails.

In yet another exemplary method, running a second test with a new MISR polynomial or having a second MISR with the new MISR polynomial running concurrently with the first MISR, may not change the multiple bit fails to an immediately recognizable data pattern. However, the new data pattern from the new MISR polynomial may allow the system to more readily rate a probability of any fail. An algorithm may look at each bit flip and credit all latches that could cause the bit flip. One latch that matches multiple bit flips would naturally get more credit, so more MISR data would allow for more accurate differentiation among latches. Using a larger MISR, i.e., an MISR that provides a compressed signature of a greater number of bits, would similarly serve to more accurately differentiation among latches.

Multiple tests are typically combined for BIST logic, and sometimes for OPMISR modes. This increases the data field significantly, and allows for the same fail to show up in the same latch multiple times. The aperture insert data value correction may be expanded to allow a correction stream to be loaded, to correct a known failing bit and maintain the same expected MISR.

An alternative implementation of the IHT 540 may be based on fault flip signatures. In this case, each fault would simulate a set of flipped latches for each pattern, such that the latch pattern equates to a MISR result that has been logged. The MISR result would have to point to a reasonable number of potentially flipped latches, so that a cone of faults feeding each potentially flipped latch can be simulated to see if the MISR flips match any of the failure latch flip signatures stored in the IHT.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   built-in self-test (BIST) logic of a circuit under test (CUT), the BIST logic further comprising: a mask that selectively masks at least one channel of scan chain elements corresponding to logic circuits of the CUT; Hamming logic that minimizes aliasing; a multiple input shift register (MISR) that receives Hamming data and unloads a compressed MISR signature; and an aperture point enabled by a scan counter of the scan chain elements that inserts a data value into at least one of the scan chain elements transmitted to the MISR; and
   a tester, external to the BIST logic and the CUT, the tester further comprising at least: a controller, an isolation hash table (IHT), a CUT MISR data store, and a channel MISR data store, the controller controlling communications between the BIST logic, the CUT, the CUT MISR data store, the channel MISR data store, and the IHT, the IHT translating signature fail data from the MISR to a failure location of a latch in the CUT.

2. The system of claim 1, the mask receiving channels and selectively masking, by operation of the controller, all but at least one of the channels.

3. The system of claim 1, the MISR providing the compressed MISR signature.

4. The system of claim 1, the aperture point inserting the data value into at least one of the scan chain elements transmitted to the MISR until a resulting compressed MISR signature changes matches an entry in the IHT.

5. The system of claim 1, contents of the IHT being solely dependent upon a depth of a longest channel, operation of any Hamming logic on the scan chains, and a MISR feedback equation.

6. A method comprising:
   storing compressed multiple input shift register (MISR) expect data for each scan cell of each scan chain of each channel scanned from a passing integrated circuit (IC);

storing a failure location of a latch translated from signature fail data from the MISR in an isolation hash table (IHT);
running a standard test, using circuit under test (CUT) MISR data, of the CUT, where for each scan cell of each scan chain of each channel at least one compressed MISR signature does not match the MISR expect data and where translated bits of the at least one compressed MISR signature match an entry in the IHT;
storing compressed MISR single channel expect data for each scan chain of each single channel scanned from a passing IC;
running a standard test, using channel MISR data, of the CUT, where for each scan cell of each scan chain of a selected single channel at least one compressed MISR single channel signature does not match the MISR single channel expect data and where translated bits of the at least one compressed MISR single channel signature do not match an entry in the IHT; and
running a standard test, using the channel MISR data, of the CUT, where a selected data value is inserted into at least one location of a scan chain of the selected single channel for transmission to the MISR, resulting in a compressed MISR signature change that when translated matches an entry in the IHT, to provide the failure location of the latch in the CUT.

7. The method of claim 6, the selected data value including one of: 0 and 1.

8. The method of claim 6, the selected data value being sequentially inserted into each location of the scan chain of the selected channel until the resulting compressed MISR signature change, when translated, matches the IHT.

9. The method of claim 6, the selected single channel being selectively iterated, such that, all single channels for which the at least one compressed MISR single channel signature did not match an entry in the IHT are selectively iterated for insertion of the selected data value.

10. A method comprising:
storing compressed multiple input shift register (MISR) expect data for each scan chain of each channel scanned from a passing integrated circuit (IC);
storing a failure location for each scan cell of each scan chain of each channel translated from signature fail data from the MISR in an isolation hash table (IHT);
running a standard test, using circuit under test (CUT) MISR data, of the CUT to determine if the CUT fails;
running channel diagnostics, using channel MISR data for every channel of the CUT to determine if at least one of the channels fails; and
running aperture diagnostics, using the channel MISR data, for every failing channel of the CUT to determine a failure location of the latch in the CUT.

11. The method of claim 10, the running of the standard test of the CUT to determine if the CUT fails further comprising:
if each resulting compressed MISR signature matches the compressed MISR expect data for each scan cell of each scan chain of each channel of the CUT, then the CUT passes, otherwise at least one resulting compressed MISR signature fails.

12. The method of claim 11, the failing of the at least one resulting compressed MISR signature further comprising:
hashing the at least one resulting compressed MISR signature; and
comparing the at least one resulting compressed MISR signature to the IHT, to determine a failing bit corresponding to the failure location of the latch of the CUT.

13. The method of claim 10 further comprising, before the running of channel diagnostics for every channel of the CUT, storing compressed MISR single channel expect data for each scan cell of each scan chain of each single channel scanned from a passing IC.

14. The method of claim 13, the running of the channel diagnostics for every channel of the CUT to determine if at least one of the channels fails further comprising:
selecting a single channel for testing; and
if each resulting compressed MISR single channel signature matches the compressed MISR single channel expect data for each scan cell of each scan chain of the selected single channel of the CUT, then the single channel passes, otherwise the resulting compressed MISR single channel signature fails.

15. The method of claim 14, the failing of the resulting compressed MISR single channel signature further comprising:
hashing the resulting compressed MISR single channel signature; and
comparing the resulting compressed MISR single channel signature to the IHT, to determine a failing bit corresponding to the failure location of the latch of the CUT.

16. The method of claim 10, the running of the aperture diagnostics for every failing channel of the CUT to determine a failure location of the latch in the CUT further comprising:
selecting a single failing channel for testing;
inserting a selected data value into at least one location of a scan chain of the selected single failing channel for transmission to the MISR; and
observing a compressed MISR signature change to the selected single channel produced by the inserted selected data value.

17. The method of claim 16 further comprising:
hashing the resulting compressed MISR signature change; and
comparing the resulting compressed MISR signature change to the IHT, to determine a failing bit corresponding to the failure location of the latch of the CUT; and noting the aperture location for a second failure location.

18. The method of claim 16, the selected data value including one of: 0 and 1.

19. The method of claim 18, the selected data value being sequentially inserted into each location of the scan chain of the selected channel until the compressed MISR signature change, when translated, matches the IHT.

20. The method of claim 19, the matching IHT providing a failure location of a latch of the CUT.

* * * * *